United States Patent

[11] 3,596,149

[72] Inventor Tsugio Makimoto
Kodaira-shi, Japan

[21] Appl. No 4,468
[22] Filed Jan. 19, 1970
[45] Patented July 27, 1971
[73] Assignee Hitachi, Ltd.
Tokyo, Japan
[32] Priority Aug. 16, 1967
[33] Japan
[31] 42/52220
Continuation of application Ser. No. 752,049, Aug. 12, 1968.

[54] SEMICONDUCTOR INTEGRATED CIRCUIT WITH REDUCED MINORITY CARRIER STORAGE EFFECT
10 Claims, 8 Drawing Figs.

[52] U.S. Cl. .......... 317/235 R, 317/234 R, 317/235 E, 317/235 AM, 317/235 D, 317/235 X, 148/187
[51] Int. Cl. .......... H01l 19/00
[50] Field of Search .......... 317/235, 22, 221, 40.1, 43, 482

[56] References Cited

UNITED STATES PATENTS

| | | | |
|---|---|---|---|
| 3,380,153 | 4/1968 | Husher et al. .......... | 29/577 |
| 3,414,783 | 12/1968 | Moore .......... | 317/235 |
| 3,299,329 | 1/1967 | Pollock .......... | 317/235 |
| 3,450,959 | 6/1969 | Dale .......... | 317/235 |
| 3,465,215 | 9/1969 | Bohannon, Jr. .......... | 317/235 |
| 3,474,308 | 10/1969 | Kronlage .......... | 317/235 |

*Primary Examiner*—John W. Huckert
*Assistant Examiner*—B. Estrin
*Attorney*—Craig, Antonelli & Hill

ABSTRACT: A semiconductor integrated circuit in which a P-type semiconductor layer epitaxially grown on the surface of a P-type semiconductor substrate containing $N^+$ buried layers therein is divided into a plurality of electrically isolated portions by $N^+$ type regions which are formed by diffusing a donor impurity into the surface of said P-type semiconductor layer towards the $N^+$ type buried layers, the divided P-type semiconductor portions forming individually diodes and transistors with the $N^+$ type regions connected to said buried layers as their structural elements.

INVENTOR
TSUGIO MAKIMOTO

BY Craig & Antonelli
ATTORNEYS

INVENTOR

TSUGIO MAKIMOTO

BY Craig & Antonelli

ATTORNEYS

SEMICONDUCTOR INTEGRATED CIRCUIT WITH REDUCED MINORITY CARRIER STORAGE EFFECT

This is a continuation of Ser. No. 752,049 filed Aug. 12, 1968.

BACKGROUND OF THE INVENTION

1. Field of the Invention

This invention relates to a semiconductor integrated circuit and a manufacturing method thereof, and more particularly to improvements on a saturated-type logical circuit comprising diodes and transistors.

2. Description of the Prior Art

Recently with the development of high-speed electric computers, high-speed switching elements or circuits have been desired and proposed. For example, as a proposal to speed up the function of a logical circuit consisting of PN junction diodes and bipolar transistors the transistors are operated under nonsaturated conditions. However, it is a very difficult problem to realize a high-speed saturated-type logical circuit by extending the action of the transistors to the saturation region because of the storage effect of the so-called minority carrier. As a solution to this problem it is proposed to introduce a certain kind of metal, e.g. gold, having the effect of reducing the lifetime of the carrier into the collector and base regions.

Such a method, however, encounters a difficulty in integrating the high-speed logical circuit, as it is not simple in the present technique to diffuse the lifetime killer such as gold into a selected portion. In particular, in the case of a D.T.L. circuit or a logical circuit comprising diodes and transistors the requirements are that one or more level shift diodes connected to the bases of transistors have a large carrier storage effect while a plurality of gating diodes connected to these level shift diodes have a small one as the gating diodes as well as the switching transistors need a rapid recovery action. Therefore, when the D.T.L. circuit is integrated in a semiconductor substrate, it is difficult to diffuse gold having a high diffusion speed selectively to some of the diodes and transistors which are positioned adjacent to one another and have opposite characteristics.

SUMMARY OF THE INVENTION

One object of this invention is to provide a semiconductor integrated circuit comprising switching elements, particularly transistors, having a reduced minority carrier storage effect.

Another object of this invention is to provide a semiconductor integrated circuit comprising diodes and/or transistors with a reduced minority carrier storage effect and switching elements with a suitably increased one, thus improving the switching characteristic.

A further object of this invention is to provide a semiconductor integrated circuit comprising transistors having a small collector saturation resistance and collector capacitance through the use of the advanced isolation technique, thereby increasing the integration density of the elements.

Still another object of this invention is to provide a simple industrial method for manufacturing a semiconductor integrated circuit fulfilling the above-mentioned objects through the use of the epitaxial growth technique.

A semiconductor integrated circuit provided according to one embodiment of this invention is as follows. A first conductivity-type semiconductor layer having a relatively low surface impurity concentration is epitaxially grown on the surface of a first conductivity-type semiconductor substrate having a plurality of second conductivity-type buried layers in one principal surface thereof. The first conductivity-type semiconductor layer is divided into a plurality of electrically isolated portions by second conductivity-type regions which are formed by diffusing a second conductivity-type determining impurity in a closed ring shape into the surface of the first conductivity-type semiconductor layer towards the buried layers. The divided plural portions constitute individual switching elements such as diodes and transistors, the buried layers and the second conductivity-type impurity regions serving as their structural elements.

In the above constitution, transistors are formed in the following manner. The first conductivity-type highly doped region is selectively formed in one portion (first isolated region) of the epitaxially grown layer surrounded with the buried layers and the second conductivity-type regions. Second conductivity-type highly doped regions are selectively formed as the emitter regions in the first highly doped region. The buried layers and the second conductivity-type regions connected therewith are utilized as collector regions. The first conductivity-type highly doped regions and the epitaxially grown layers having a relatively low surface impurity concentration serve as the base regions with a gradient of impurity concentration. The width of the base regions is defined less than the diffusion length of the minority carrier existing therein.

The diodes making the high-speed recovery action are obtained simultaneously in the same manner by fitting one electrode to the emitter regions of different transistors formed in the second isolated regions and the other electrode to their base-collector junctions.

The diodes having a large carrier storage effect are obtained as follows. Second conductivity-type highly doped regions are formed in the third isolated regions simultaneously with the formation of the emitter regions of the above transistors thereby to constitute still other transistors not having the first conductivity-type highly doped regions. A pair of electrodes are fitted to the collector regions and the emitter-base junctions of the individual transistors thus obtained.

The fourth isolated region is used as a resistor by forming a pair of electrodes in two different portions thereon.

A concrete embodiment of this invention will be described hereinafter as to the technique of constituting a D.T.L. circuit by preparing the necessary number of the above-mentioned diodes, transistors and resistors.

The above and other objects and features of this invention will be made more apparent by the following explanation of the preferred embodiment of this invention taken in conjunction with the accompanying drawings.

DESCRIPTION OF THE PREFERRED EMBODIMENTS

Figure 1:
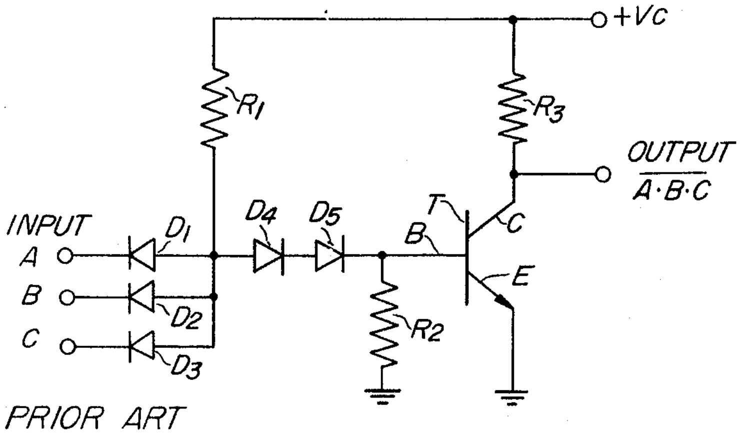
FIG. 1 shows a circuit diagram showing an NAND circuit as a typical D.T.L. circuit integrated in one semiconductor body.
Figure 2:
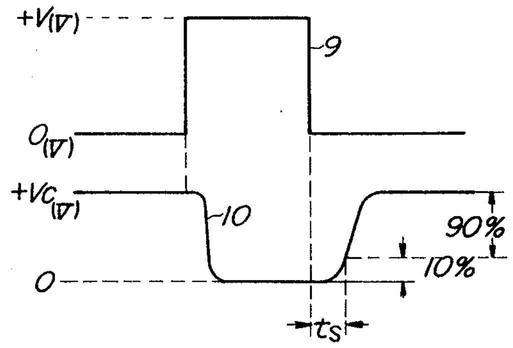
FIG. 2 shows waveforms drawn for explaining this invention.

A typical example of the saturated-type logical circuit as shown in FIG. 1 is a diode-transistor-logical circuit. In FIG. 2 showing the input and output waveforms, it is seen that the output wave 10 lags behind the input wave form 9 and is distorted. This invention aims in particular at improving the decrease of minority carrier storage time ($t_s$).

Figure 3:
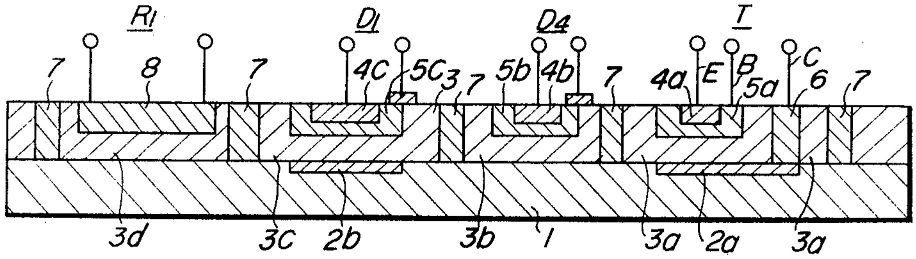
FIG. 3 PRIOR ART
FIG. 3 is a cross-sectional view showing an example of a prior art semiconductor circuit integrating the circuit configuration as shown in FIG. 1.

FIG. 3 shows a prior art semiconductor circuit integrating the NAND circuit shown in FIG. 1. In this figure like reference numerals are used to denote parts similar to those shown in FIG. 1. T is an invertor transistor region, $D_4$ is a level shift diode region, and $D_1$ is a gate diode region. The member 1 is a P-type substrate layer, and 2*a* and 2*b* are $N^+$ layers, usually called buried layers, formed by diffusing impurity selectively into some portions of the substrate. The layers 3*a* to 3*d* are N-type epitaxial layers (EP layers) formed on the substrate 1, isolated from one another by $P^+$ type isolation regions 7 which are highly doped with an acceptor impurity. The $P^+$ type regions 7 are formed in the following manner. First $P^+$ layers are partially formed in the surface of the substrate 1 in advance as the first diffusion sources. After the formation of the EP layers an acceptor impurity is diffused from the first diffusion sources into the EP layers. At the same time another acceptor impurity is also diffused from second diffusion sources into the surface of the EP layers so as to be in register with the first diffusion sources. The regions 4*a* to 4*c* and 5*a* to 5*c* are base and emitter regions respectively. The region 6 is a diffused $N^+$ type high impurity concentration region having the same conductivity type as that of the collector regions. This region is provided to decrease the collector series resistance at the collector terminals. The formation is performed in the same manner as that of the above isolation regions 7 except that the impurity used is donor. Diodes $D_1$ and $D_4$ are constituted so that the emitter region forms one electrode while the base and collector regions are short circuited to form the other electrode. $R_1$ is a resistor consisting of a P-type resistor channel 8 and a pair of electrodes fitted to both ends of the channel 8. The P-type resistor channel 8 is formed by diffusing acceptor impurity in the isolated region 3*d*.

The above-mentioned minority carrier storage time depends on the charges stored in the inverter transistor T. It is generally practiced to diffuse gold in the transistor T to decrease the lifetime and hence the number of the storage minority carriers. However, the application of such a method to the integrated circuit is extremely difficult due to the following reasons.

1. Since the above semiconductor integrated circuit constitutes its whole circuit network in an extremely small semiconductor piece, the gate diode, the transistor, and the level shift diode regions are located adjacent to one another. Therefore, it is a very difficult task to diffuse gold having high diffusion speed selectively in the transistor region and the gate diode region only.

2. When gold is diffused in the level shift diode region $D_4$, the charge storage in this diode becomes extremely small. Therefore, it becomes impossible to utilize the charge storage phenomenon of this diode and to set the base potential of transistor T at zero or a reverse bias.

3. If the level shift diode region is separated at a distance from the invertor transistor and the gate diode regions sufficient to prevent the diffusion of gold to the level shift diode, the degree of integration per unit area decreases.

Next, an embodiment of this invention will be explained in detail with reference to FIGS. 4*a* to 4*e*.

Figure 4A:
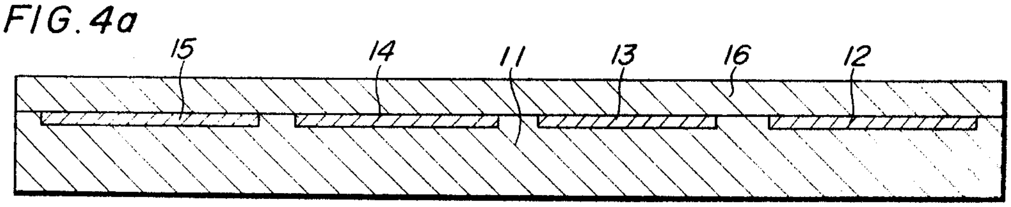
FIGS. 4*a* to 4*e* are cross-sectional views showing a semiconductor integrated circuit according to this invention integrating the circuit configuration as shown in FIG. 1.
Figure 4B:
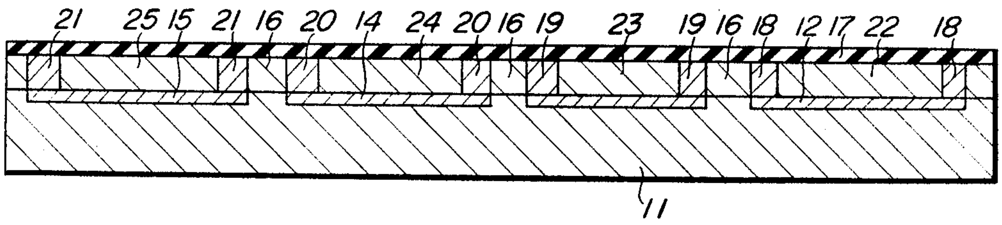
Figure 4C:
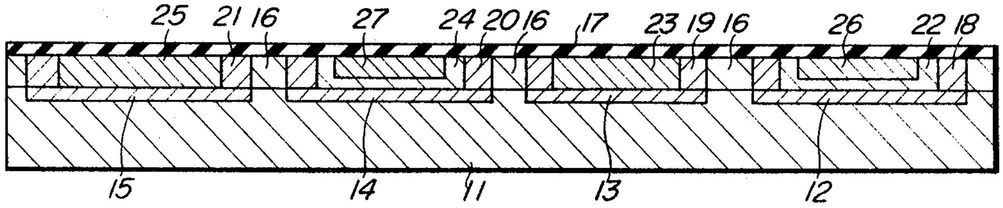
Figure 4D:
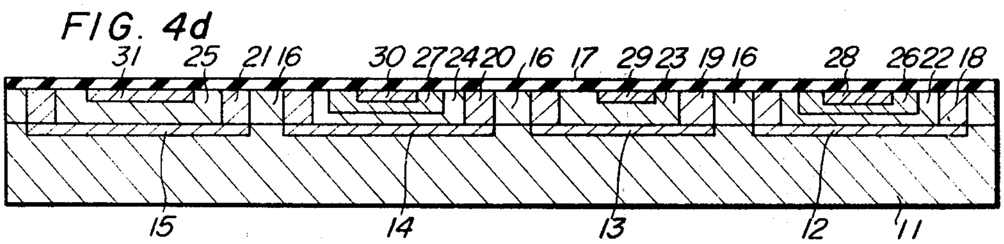
Figure 4E:
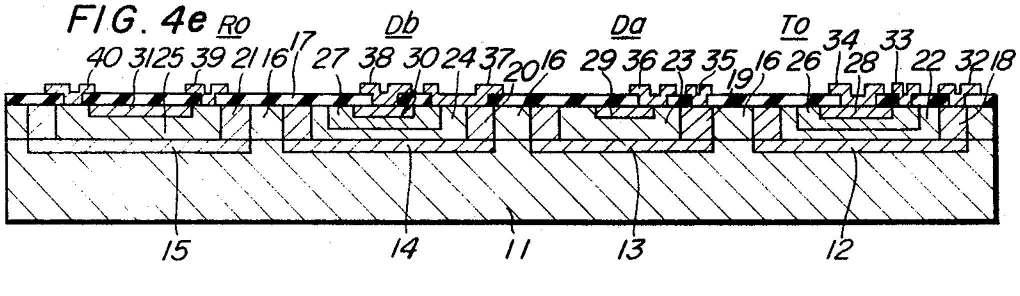

FIG. 4*e* shows a cross section of a semiconductor integrated circuit comprising a transistor T*o*, diodes D*a* and D*b*, and a resistor R*o* in a semiconductor body. The first conductivity-type semiconductor substrate 11 has second conductivity-type diffused regions 12 to 15 in one principal surface thereof. An epitaxially grown semiconductor layer 16 of the first conductivity-type having a relatively low impurity concentration is formed on the above principal surface to cover the second conductivity-type regions 12 to 15. The semiconductor layer 16 is divided into a plurality of epitaxial semiconductor regions 22 to 25 lying on the second conductivity regions 12 to 15 respectively and electrically isolated from one another by the second conductivity-type diffused regions 18 to 21. Since the epitaxial semiconductor regions 22 to 25 are grown simultaneously with the semiconductor layer 16, their impurity concentrations and widths are nearly equal to those of the semiconductor layer 16. First conductivity-type regions 26 and 27 having a nearly equal impurity concentration and depth are formed in the surface of the epitaxial semiconductor regions 22 and 24 respectively. Second conductivity-type diffused regions 28 to 31 having a nearly equal surface impurity concentration and depth are formed in the surface of the first conductivity-type regions 26 and 27 and the epitaxial semiconductor regions 23 and 25 respectively. Conducting layers 32 to 34 serve as the collector, base and emitter electrodes of the high-speed switching transistor T*o* respectively. Conducting layers 35 and 36 form a pair of electrodes of the diode D*a* having a large carrier storage effect, the electrode 36 short circuiting the regions 23 and 29. The conducting layer 38 formed on the diffused region 30 and the conducting layer 37 short circuiting the regions 20, 24 and 27 form a pair of electrodes for the high-speed switching diode D*b* having a small carrier storage effect. The first conductivity-type epitaxial region 25 forms a resistor channel whose resistance is defined by the second conductivity-type regions 15, 21 and 31. Electrodes 39 and 40 are fitted to both ends of the region 25. It is preferable that the regions 12 to 15, 18 to 21 and 28 to 31 of the second conductivity-type have a relatively high surface impurity concentration, e.g. about $5\times10^{19}$ to $2\times10^{21}$ atoms/cm.$^3$. The surface of the semiconductor body is covered with an insulating film 17 such as silicon dioxide to be protected from the external atmosphere.

In the above integrated circuit thus constructed, the transistor T*O* has the $N^+P^+P^1N^+$ or $P^+N^+N^1P^+$ structure (the expression shows the order of junction structure from the emitter to collector sides). The fact that the collector 12 of the transistor T*o* is a high impurity concentration region has an advantage, namely that the carrier storage in the collector region under the saturated condition is negligibly small. Furthermore, the transistor T*o* has a small saturated resistance and collector barrier capacitance. The first conductivity-type highly doped region 26 gives a large gradient of concentration to the base region. Thus the switching characteristic of transistor T*o* becomes satisfactory both in the on and in the off state. The danger that the minority carriers might be stored more in the $P^1$ type high resistivity region 22 in the base region of an $N^+P^+P^1N^+$ type transistor is out of question because the thickness of the $P^1$ type region 22 is made sufficiently small, for example, smaller than 0.5 $\mu$. In a conventional epitaxial transistor ($N^+PN^1N^+$ structure) the $N^1$ type collector region has a relatively large width, about 2 $\mu$, and hence has a large carrier storage effect. For example, the recovery time of the conventional epitaxial transistor is typically about 25 n sec. while that of the transistor without this $N^1$ type collector layer according to this invention can be about 15 n sec.

The PN junction diode D*b* in the above circuit consists of substantially two regions 27 and 30 having a high impurity concentration and a PN junction formed therebetween. Therefore, this diode has a small carrier storage effect and the recovery time is short.

The PN junction diode D*a* consists of the regions 19 and 13 having a high impurity concentration, the region 23 having a uniform distribution of low impurity concentration, and PN junctions formed between these regions. Therefore, the storage carrier becomes rich in the low impurity concentration region 23 and hence the diode has slow recovery time. The diode D*a*, if necessary, may have one electrode on the region 23 and the other electrode on the region 19 and 29 by short circuiting them. The PN junction formed between the regions 23 and 29 may be utilized for the diode D*a*.

The resistor channel 25 in the resistor R*o* consists of an epitaxially grown semiconductor having a uniform distribution of impurity and relatively high resistivity. This structure is advantageous in that a relatively high resistance is realized simply in a small area. The current never concentrates on the surface because of the existence of the second conductivity-type region.

It is apparent therefore that the application of the above-mentioned semiconductor integrated circuit to the NAND circuit shown in FIG. 1 yields an excellent integrated NAND circuit by preparing three diodes D*b* having rapid recovery time for the gate diodes $D_1$, $D_2$ and $D_3$, two diodes D*a* for the level shift diodes $D_4$ and $D_5$, a high-speed switching transistor T*o* for the invertor transistor T, and three resistors R*o* for the resistors $R_1$, $R_2$ and $R_3$.

Next, the manufacturing method of an integrated NAND circuit in accordance with the circuit composition as shown in FIG. 1 will be explained with reference to FIGS. 4*a* to 4*e*. For the sake of brevity, an explanation will be given of a typical resistor and diodes having different recovery speed because others can be similarly produced.

First as shown in FIG. 4*a*, a first conductivity-type semiconductor substrate 11 of $P^1$ type silicon having a resistivity of the order of 20 to 50 Ωcm. is prepared. A first conductivity-type high resistivity silicon layer 16 is epitaxially grown on one principal surface of the substrate. Preliminarily, four $N^+$ diffused regions 12 to 15, called buried layers, are formed in the surface of the $P^1$ type silicon substrate by diffusing antimony or arsenic. These diffused regions 12 to 15 have a high surface impurity concentration, e.g. $10^{20}$ atoms/cm.$^3$. The epitaxial silicon layer 16 (EP layer) is doped weakly and uniformly with acceptor impurity to have a relatively high resistivity of the order of 0.5 Ωcm. Here $P^1$ means that the quantity of the doped impurity is small.

Next as shown in FIG. 4*b*, with an insulating film 17 such as silicon dioxide as a selective mask a donor impurity e.g. phosphorus is selectively diffused in a closed ring shape into the above $P^1$ type EP layer to form $N^+$ type diffused regions 18 to 21 having a surface impurity concentration of about $10^{21}$ atoms/cm.$^3$. In this step the $P^1$ type EP layer 16 is divided into plural portions 22 to 25, which are electrically isolated from one another and from both the $P^1$ type substrate 11 and the remaining portions of the epitaxial layer 16. The above isolation diffusion treatment is attained simply for a short time as the antimony or arsenic diffused from the buried layers 12 to 15 to the EP layer 16 and the phosphorus introduced from the surface of the EP layer can meet each other in the EP layer.

FIG. 4*c* shows the step of base diffusion. With the film 17 as the selective mask an acceptor impurity e.g. boron is selectively diffused to form $P^+$ type diffused regions 26 and 27 having a relatively high surface impurity concentration of about $5\times10^{18}$ atoms/cm.$^3$. These $P^+$ type regions 26 and 27 are not sufficiently deep to reach the buried layers 12 and 14 respectively, for example 1.8 μ thick.

FIG. 4*d* shows the step of forming $N^+$ type diffused regions 28 to 31, the surface impurity concentrations of which are as high as about $10^{21}$ atoms/cm.$^3$. Their depths are defined about 1.5 μ so that the distances from these regions 28 to 31 to the buried layers 12 to 15 respectively are smaller than the diffusion length of electron carriers. The $N^+$ type regions 28, 29 and 30 have a large influence on the electrical characteristics of the transistors and diodes. The $N^+$ type region 31 together with the $N^+$ type region 21 are important elements defining the resistance value of the resistor.

Finally as shown in Fig. 4*e*, using the evaporation and photoetching techniques, electrodes made of, e.g. aluminum, are fitted to the predetermined portions as described above.

An integrated circuit according to this invention having the above-mentioned structure has the following effects.

1. Since the collector of the invertor transistor is constituted by a high impurity concentration region, the collector series resistance $Rcs$ can be made extremely low.

2. Since the collector region of the invertor transistor is heavily doped with an impurity, the charge storage at the collector and hence the storage time $t_s$ is negligibly small. Therefore, the circuit characteristics are remarkably improved.

3. Since the resistivity of the $P^1$ type EP layer can be made higher than that of a prior art one, the collector capacitance $C_{ob}$ can be made small.

4. Since the resistivity of the $P^1$ type EP layer and the $P^1$ type substrate may be selected high, the isolation capacitance can be made small.

5. Since the PN junction of the level shift diode is formed between the semiconductor layers with a high impurity concentration and with a uniform distribution of low impurity concentration, the minority carrier storage becomes large.

6. Since the donor impurity is phosphorus which has a relatively large diffusion coefficient and the EP layer is made thinner than the conventional one, the isolation diffusion work can be simply done in a short time.

7. The isolation among the elements with the aid of the buried layers and the EP layer is convenient when a plurality of circuit elements are to be formed in a single semiconductor body. So, the integration density of elements can be increased.

Although the above explanation of this invention has been given in respect to diode-transistor-logical circuit means, it is needless to say that the principle of this invention may be applied to other similar saturated-type logical integrated circuit means such as resistance-transistor-logical (R.T.L. circuit) and transistor-transistor logical integrated circuit means (T.T.L. circuit).

Minute modifications of this invention may be easily made by those skilled in the art without departing from the appended claims.

I claim:

1. A semiconductor integrated circuit comprising:

a first conductivity-type semiconductor substrate having one principal surface, in which first and second regions of a second conductivity type extend covered with an epitaxially grown semiconductor layer of the first conductivity type having a relatively low impurity concentration;

third and fourth, diffused regions of the second conductivity type formed in a closed shape and extending from the surface of said epitaxial semiconductor layer to said first and second regions thereunder so as to surround and electrically isolate first and second semiconductor portions of said epitaxially grown semiconductor layer positioned respectively on said first and second regions;

a fifth, diffused region of the first conductivity type having a relatively high surface impurity concentration and formed in the surface of said first semiconductor portion;

a sixth, diffused region of the second conductivity type formed in the surface of and more shallowly than said fifth region, the distance from said sixth region to said first region being less than the diffusion length of the minority carrier in the first conductivity-type region; and first, second and third electrodes formed on the surfaces of said third, fifth and sixth regions, respectively.

2. A semiconductor integrated circuit according to claim 1, wherein said first and second conductivity types are P and N types respectively; said substrate and said semiconductor layer are made of silicon; and said first to fourth and sixth regions have a surface impurity concentration of about $5\times10^{19}$ to $2\times10^{21}$ atoms/cm.$^3$.

3. A semiconductor integrated circuit comprising:

a first conductivity-type semiconductor substrate having one principal surface in which first and second regions of a second conductivity type extend covered with an epitaxially grown semiconductor layer of the first conductivity type having a relatively low impurity concentration;

third and fourth, diffused regions of the second conductivity type formed in a closed shape and extending from the surface of said semiconductor layer to said first and second regions so as to surround and electrically isolate first and second portions of said semiconductor layer positioned on said first and second regions respectively;

a fifth, diffused region of the first conductivity type formed in the surface of said first portion of said semiconductor layer and having a relatively high surface impurity concentration;

sixth and seventh, diffused regions of the second conductivity type in the surfaces of said fifth region and the second portion of said semiconductor layer, respectively, having substantially the same depth and surface impurity concentration, the depth of said sixth region being defined as being less than that of said fifth region and the distance from said sixth region to said first region being less than the diffusion length of the minority carrier in the first conductivity-type region;

first, second and third electrodes formed respectively on the surfaces of said third, fifth and sixth regions; and fourth and fifth electrodes formed respectively on the surfaces of said fourth region and said second portion of said semiconductor layer.

4. A semiconductor integrated circuit according to claim 3, wherein said second portion of the semiconductor layer contains an eighth, diffused region of the first conductivity type having said seventh region therein, the surface of said eighth region being fitted with a sixth electrode connected to said fourth and fifth electrodes, and said seventh region being fitted with a seventh electrode.

5. A semiconductor integrated circuit according to claim 3, wherein said second and third electrodes are short circuited.

6. A semiconductor integrated circuit according to claim 3, wherein said first and second conductivity types are N and P types respectively;

said substrate and semiconductor layer are both made of silicon; and said first to fourth, sixth and seventh regions of second conductivity type have a surface impurity concentration of about $5\times10^{19}$ to $2\times10^{21}$ atoms/cm.$^3$.

7. A semiconductor integrated circuit consisting of at least one transistor portion and at least two diode portions comprising:

a first conductivity-type semiconductor substrate having one principal surface in which first, second and third regions of a second conductivity type extend covered with an epitaxially grown semiconductor layer of the first conductivity type having a relatively low impurity concentration;

fourth, fifth and sixth, diffused regions of the second conductivity type like formed in a closed shape and extending from the surface of said semiconductor layer to said first to third regions so as to surround and electrically isolate first, second and third portions of said semiconductor layer positioned on said first to third regions, respectively;

seventh and eighth, diffused regions of the first conductivity type having a relatively high impurity concentration formed in the surfaces of said first and second portions of the semiconductor layer having substantially the same depth and surface impurity concentration, respectively;

ninth, tenth and eleventh, diffused regions of the second conductivity type formed in the surfaces of said seventh and eighth regions and said third portion of the semiconductor layer to have substantially the same depth and surface impurity concentration, respectively;

first and second electrodes fitted to the surfaces of said ninth and tenth regions;

a third electrode fitted to the surface of said seventh region;

a fourth electrode fitted to the surface of said fourth region surrounding the first portion of said semiconductor layer;

a fifth electrode short circuiting said fifth region surrounding said second portion of said semiconductor layer with said eighth region; and sixth and seventh electrodes fitted to said third portion of the semiconductor layer and said sixth region, respectively;

said first, third and fourth electrodes and the semiconductor regions connected therewith constituting a transistor;

said second and fifth electrodes and the semiconductor regions connected therewith constituting a first diode portion; and said sixth and seventh electrodes and the semiconductor portions connected therewith constituting a second diode portion.

8. A semiconductor integrated circuit according to claim 7, comprising a resistor portion including a twelfth region of the second conductivity type extending in said principal surface of said substrate, a thirteenth, diffused region of the second conductivity type formed in a closed ring shape and extending from the surface of said semiconductor layer to said twelfth region thereunder so as to surround and electrically isolate a fourth portion of said semiconductor layer positioned on said twelfth region, and eighth and ninth electrodes fitted to two different portions of the surface of said fourth portion of the semiconductor layer.

9. A semiconductor integrated circuit according to claim 7, wherein said first to sixth and ninth to eleventh regions have a surface impurity concentration of about $5\times10^{19}$ to $2\times10^{21}$ atoms/cm.$^3$; said first and second conductivity types are P and N type respectively; and said semiconductor substrate and said epitaxially grown semiconductor layer are made of silicon.

10. A semiconductor integrated circuit comprising a first conductivity-type semiconductor substrate having one principal surface; a plurality of first regions of a second conductivity type formed in said one principal surface of the substrate and having an impurity concentration not less than $5\times10^{19}$ atoms/cm.$^3$; a semiconductor layer of the first conductivity type having a uniform and relatively low impurity concentration and formed on the one principal surface of the substrate to cover said plurality of first regions; a plurality of second, diffused regions of the second conductivity type each formed in a closed shape and extending from the surface of said semiconductor layer to the corresponding one of the first regions so as to surround and electrically isolate a portion of said semiconductor layer positioned on the corresponding one of the first regions; and a plurality of third, diffused regions of the second conductivity type formed in the isolated portions of said semiconductor layer, respectively, the distance between each first region and the corresponding third region being less than the diffusion length of the minority carrier in the first conductivity-type semiconductor material.